US010812081B1

(12) United States Patent
Seningen et al.

(10) Patent No.: US 10,812,081 B1
(45) Date of Patent: Oct. 20, 2020

(54) OUTPUT SIGNAL CONTROL DURING RETENTION MODE OPERATION

(71) Applicant: Apple Inc., Cupertino, CA (US)

(72) Inventors: Michael R. Seningen, Austin, TX (US); Michael A. Dreesen, Austin, TX (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 16/585,304

(22) Filed: Sep. 27, 2019

(51) Int. Cl.
*H03K 19/0185* (2006.01)

(52) U.S. Cl.
CPC .............................. *H03K 19/018507* (2013.01)

(58) Field of Classification Search
CPC ............................................. H03K 19/018507
USPC ............................................................ 326/80
See application file for complete search history.

(56) References Cited

U.S. PATENT DOCUMENTS

| | | | | |
|---|---|---|---|---|
| 5,448,198 A * | 9/1995 | Toyoshima | ......... | H01L 27/0218 327/530 |
| 6,307,396 B1 * | 10/2001 | Mulatti | ............. | H03K 19/0016 326/58 |
| 6,344,760 B1 * | 2/2002 | Pyo | ......................... | G11C 7/06 326/81 |
| 6,556,071 B2 * | 4/2003 | Notani | .................... | H02M 3/07 326/81 |
| 6,617,875 B2 * | 9/2003 | El-Ayat | ............ | H03K 19/17744 326/38 |
| 6,646,472 B1 * | 11/2003 | Trivedi | ...................... | G06F 1/10 326/119 |
| 7,791,374 B2 * | 9/2010 | Choi | .............. | H03K 19/018528 326/68 |
| 7,855,574 B2 * | 12/2010 | Santurkar | ............ | H03K 19/094 326/68 |
| 7,868,659 B2 * | 1/2011 | Ker | ...................... | H03K 3/0375 326/81 |
| 7,932,748 B1 * | 4/2011 | Ker | .................. | H03K 19/00384 326/68 |
| 9,240,223 B2 | 1/2016 | Song | | |
| 9,722,606 B2 | 8/2017 | Raychowdhury et al. | | |
| 10,355,676 B2 | 7/2019 | Sugahara et al. | | |
| 2005/0010887 A1 * | 1/2005 | Bednar | .................... | G11C 5/14 326/81 |

* cited by examiner

*Primary Examiner* — Don P Le
(74) *Attorney, Agent, or Firm* — Kowert, Hood, Munyon, Rankin & Goetzel, P.C.

(57) ABSTRACT

A computer system may include circuit blocks that may operate in different operating modes. When operating in a retention mode, a voltage level of a local power supply node for a particular circuit block may be less than a voltage level of the local power supply node when the particular circuit block is operating in an active mode. An output buffer circuit may be configured to generate, when the particular circuit block is operating in retention mode, an output signal using a circuit signal generated by the particular circuit block, and a voltage level corresponding to the active mode of operation.

19 Claims, 10 Drawing Sheets

OUTPUT SIGNAL CONTROL DURING RETENTION MODE OPERATION

BACKGROUND

Technical Field

This disclosure relates to retention mode in computer systems and more particularly to maintaining values of output signals from a circuit block operating in retention mode.

Description of the Related Art

A computer system may include multiple circuit blocks, each designed to perform a particular function. For example, in some computer systems, circuit blocks may include processor circuits, memory circuits, analog/mixed-signal circuits, and the like. Such circuit blocks may be capable of operating in the different operating modes. Switching between such operating modes may be based, at least in part, on power consumption or processing demands of the computer system. For example, to conserve power a computer system may change the operating modes of one or more circuit blocks to operating modes that consume less power.

Switching between the different operating modes of a particular circuit block may involve changing a voltage level of a power supply signal for the particular circuit block. In some cases, in addition to changing the voltage level of the power supply signal, a frequency of a clock signal consumed by the particular circuit block may also be adjusted.

In some operating modes a given circuit may be capable of performing operations at a desired speed. Other operating mode, e.g., retention mode, a voltage level of the power supply for the given circuit block may be reduced so that the given circuit block may not be capable of performing operations, but may still be able to maintain is logical state.

SUMMARY OF THE EMBODIMENTS

Various embodiments of an output buffer circuit are disclosed. Broadly speaking, a circuit block coupled to a local supply node may be configured to generate a circuit signal. An output buffer circuit may be configured to selectively couple either a power supply node or a retention supply node to the local supply node using at least one switch control signal. A voltage level of the retention supply node may be less than a voltage level of the power supply node. The output buffer circuit may be further configured to generate an output signal using the circuit signal and the voltage level of the power supply node. In a different embodiment, the output buffer circuit may be configured to store a state of the circuit signal using the voltage level of the power supply node.

Figure 1:
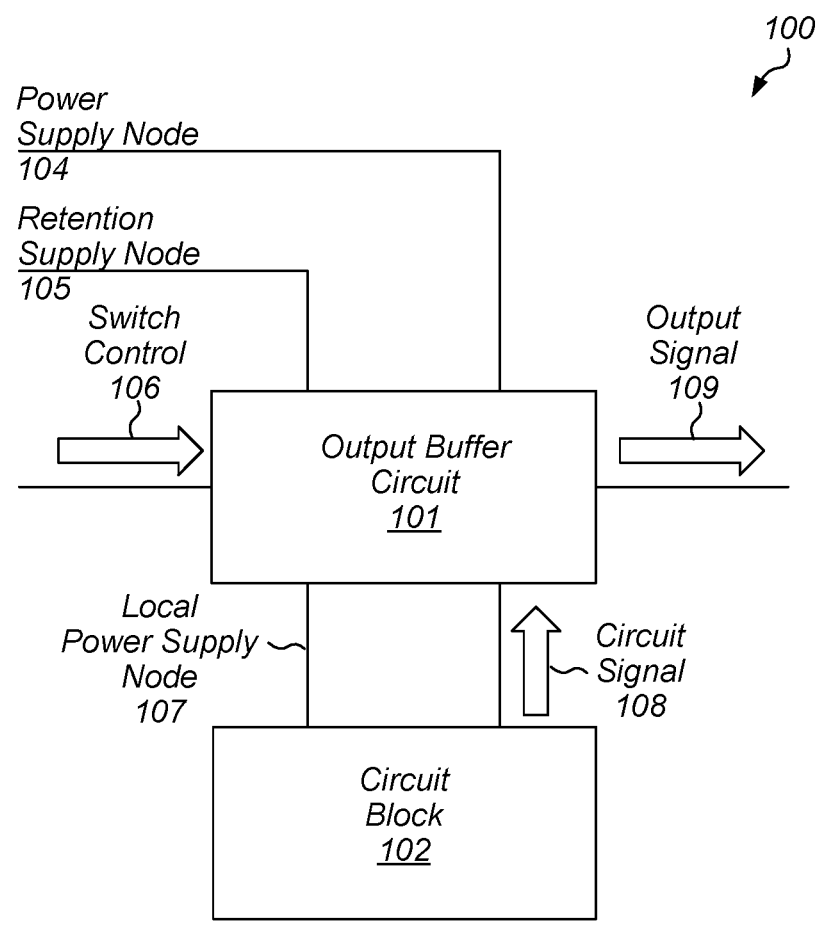
FIG. 1 is a block diagram of an embodiment of a portion of a computer system.

While the disclosure is susceptible to various modifications and alternative forms, specific embodiments thereof are shown by way of example in the drawings and will herein be described in detail. It should be understood, however, that the drawings and detailed description thereto are not intended to limit the disclosure to the particular form illustrated, but on the contrary, the intention is to cover all modifications, equivalents and alternatives falling within the spirit and scope of the present disclosure as defined by the appended claims. The headings used herein are for organizational purposes only and are not meant to be used to limit the scope of the description. As used throughout this application, the word "may" is used in a permissive sense (i.e., meaning having the potential to), rather than the mandatory sense (i.e., meaning must). Similarly, the words "include," "including," and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. § 112, paragraph (f) interpretation for that unit/circuit/component. More generally, the recitation of any element is expressly intended not to invoke 35 U.S.C. § 112, paragraph (f) interpretation for that element unless the language "means for" or "step for" is specifically recited.

As used herein, the term "based on" is used to describe one or more factors that affect a determination. This term does not foreclose the possibility that additional factors may affect the determination. That is, a determination may be solely based on specified factors or based on the specified factors as well as other, unspecified factors. Consider the phrase "determine A based on B." This phrase specifies that B is a factor that is used to determine A or that affects the determination of A. This phrase does not foreclose that the determination of A may also be based on some other factor, such as C. This phrase is also intended to cover an embodiment in which A is determined based solely on B. The phrase "based on" is thus synonymous with the phrase "based at least in part on."

DETAILED DESCRIPTION OF EMBODIMENTS

A computer system may include multiple circuit blocks that serve different functions within the computer system.

For example, a computer system may include a processor circuit block configured to execute program instructions in order to accomplish various tasks. A particular circuit block, or portions of the particular circuit block, in a computer system may not always be in use. For example, an arithmetic logic unit (or "ALU") included in a processor circuit is only used when the processor circuit is executing program instructions that involve arithmetic. When the processor circuit is executing other program instructions, e.g., a retrieval of data from a memory circuit, the ALU may be idle.

To reduce power dissipation, the computer system may change respective operation modes for circuit blocks included in the computer system. When a given circuit block is not to be used for a period of time, the computer system may place the given circuit block into a sleep mode where in the given circuit block is not powered. Alternatively, the given circuit block may be placed in a retention mode that allows the given circuit block to maintain state, i.e., maintain the status of flip-flops, latches, registers, and other storage circuits, but not perform operations. Such retention modes may be helpful in rapidly returning a circuit block to an active state to perform operations.

When a circuit block is place in retention mode, a voltage level of the power supply for the circuit block is reduced to conserve power. While the reduced level of the power supply is adequate to for storage circuits in the circuit block to continue to store data, the reduced voltage level of the power supply is insufficient to allow the circuit block to perform operations. When a particular circuit block is in retention mode, the signals generated by the circuit block for consumption by other circuit blocks may not be useable due to the reduced voltage level of the power supply. Since other circuit blocks cannot always use the signals generated by a circuit block operating in retention mode, the computer system must carefully schedule circuit blocks for entry into retention mode so as to not place a circuit block into retention mode while it is supplying signals to a circuit block that is actively performing operations. The embodiments illustrated in the drawings and described below may provide techniques for operating a circuit block in retention mode while maintain output signals at voltage levels that can be consumed by other circuit blocks.

A block diagram of a portion of a computer system is depicted in FIG. 1. As illustrated, computer system 100 includes output buffer circuit 101 and circuit block 102.

Circuit block 102 is coupled to local power supply node 107 and is configured to generate circuit signal 108. As used and described herein, a local power supply node (or simply "local power supply") is a circuit node included in a circuit block through which varying voltage levels may be applied to the circuit included in the circuit block thereby providing power to the circuit block.

In various embodiments, circuit block 102 may be any suitable type of logic circuit. For example, circuit block 102 may be a processor circuit, a memory circuit, or any other type of circuit block included in a computer system. In some cases, circuit block 102 may be a sub-block of larger circuit block. For example, circuit block 102 may be an arithmetic logic unit included in a processor circuit.

Output buffer circuit 101 is configured to selectively couple power supply node 104 or retention supply node 105 to local power supply node 107 using switch control 106. It is noted that a voltage level of retention supply node is less than a voltage level of power supply node. Output buffer circuit 101 is further configured to generate output signal 109 using circuit signal 108 and the voltage level of power supply node 104. By generating output signal 109 using the voltage level of power supply node 104, output signal 109 may be consumed by another circuit block even when circuit block 102 is operating in retention mode. Circuit blocks that consume output signal 109 need no information about the operating state of circuit block 102, which may allow circuit block 102 to be placed in retention mode more often, thereby reducing power consumption.

Figure 2:
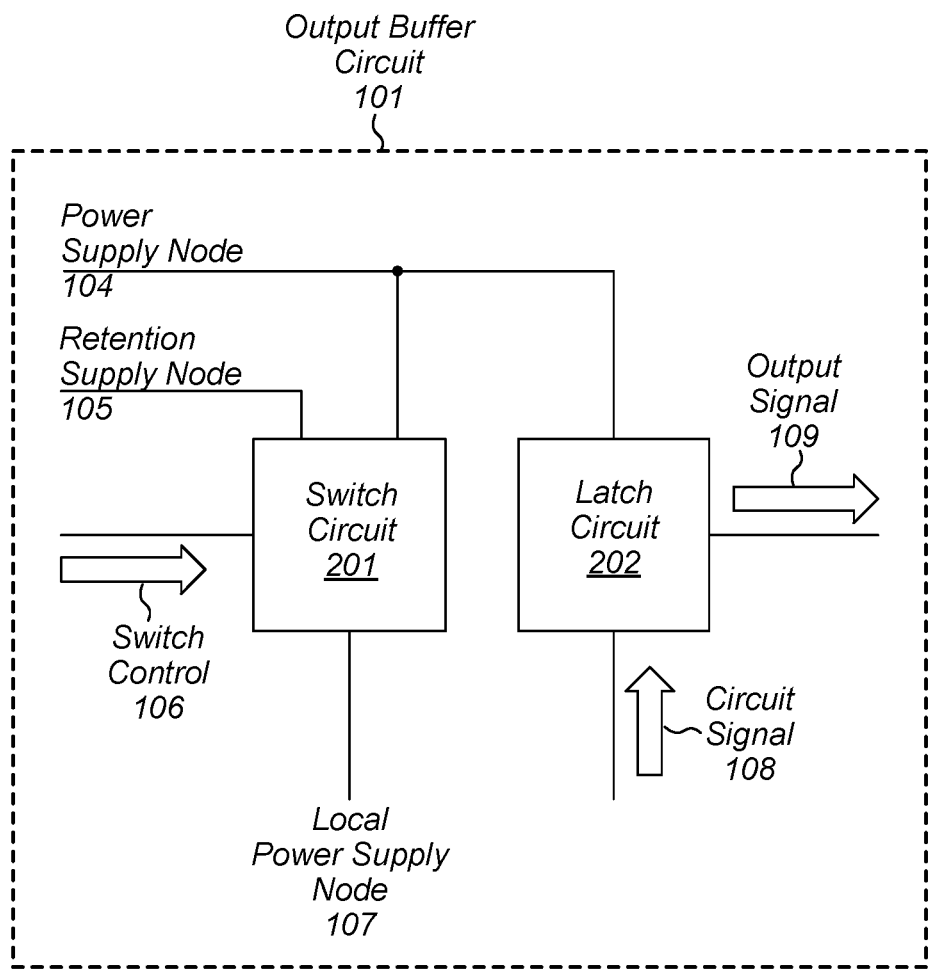
FIG. 2 illustrates a block diagram of an embodiment of an output circuit buffer.

Output buffer circuit 101 may include a variety of circuits configured to perform the above-described functionality. A particular embodiment of output buffer circuit 101 is depicted in FIG. 2. As illustrated, output buffer circuit 101 includes switch circuit 201 and latch circuit 202.

Switch circuit 201 is coupled to power supply node 104, retention supply node 105 and local power supply node 107. In various embodiments, switch circuit 201 may be configured to couple local power supply node 107 to power supply node 104 when circuit block 102 is operating in an active mode. Additionally, switch circuit 201 may be configured to decouple local power supply node 107 from power supply node 104 and re-couple local power supply node 107 to retention supply node 105 in response to circuit block 102 changing from an active mode to a retention mode. Switch circuit 201 may receive information regarding the operating mode of circuit block 102 via switch control 106. Although switch control 106 is depicted as a single signal, in other embodiments, switch control 106 may include multiple signals that may include both timing and control information.

As used and described herein, active mode refers to a mode of operation of a circuit block where a voltage level of a power supply node coupled to the circuit block is sufficient to allow for performing operations. Retention mode refers to a mode of operation of a circuit block where a voltage level of a power supply node coupled to the circuit block is sufficient to maintain state, i.e., maintain values stored in latch or flip-flop circuits, but insufficient to perform operations at a desired speed.

Latch circuit 202 is coupled to power supply node 104 and may be configured to store a logic value (or "state") of circuit signal 108 using the voltage level of power supply node 104. As described below in more detail, changes in the logic value of circuit signal 108 are captured stored in latch circuit 202. Since latch circuit 202 used the voltage level of power supply node 104, the high logic level of output signal 109 is at a voltage level sufficient to be consumed by another circuit block while local power supply node 107 is coupled to retention supply node 105.

Figure 3A:
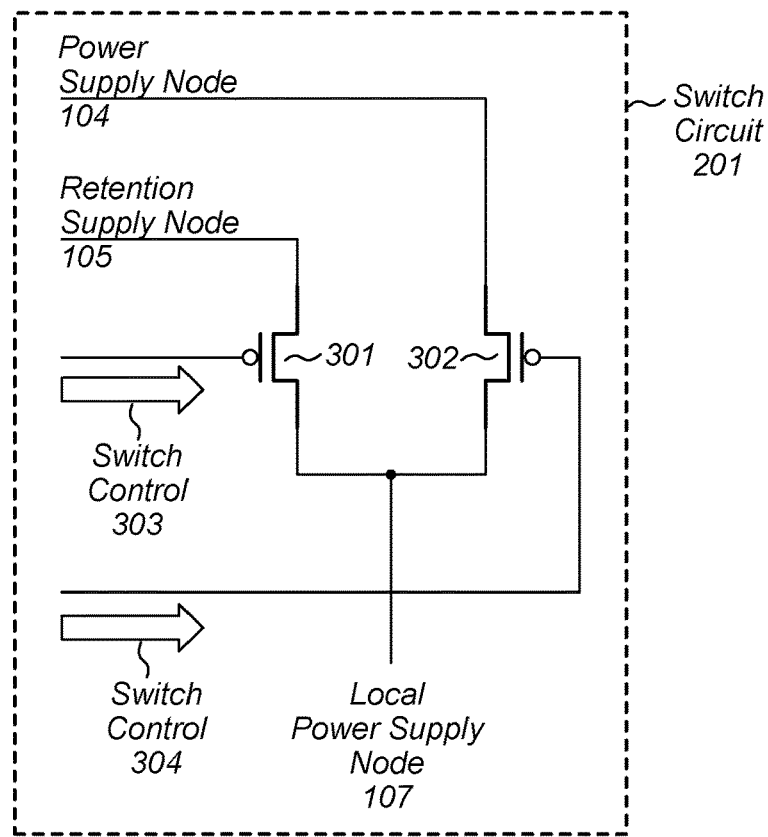
FIG. 3A illustrates a block diagram of an embodiment of a switch circuit.

A block diagram of an embodiment of switch circuit 201 is depicted in FIG. 3A. As illustrated, switch circuit 201 includes devices 301 and 302. Device 301 is coupled between retention supply node 105 and local power supply node 107, and is controlled by switch control 303. Device 302 is coupled between power supply node 104 and local power supply node 107, and is controlled by switch control 304. In various embodiments, switch control 303 and 304 may be included in switch control 106. In some cases, switch control 303 and 304 may be logical inverses of each other.

Device 301 may be a particular embodiment of a p-channel metal-oxide semiconductor field-effect transistor (MOSFET) or other suitable transconductance device whose ability to conduct current may be based, at least in part, on respective voltage levels at its terminals. For example, device 301 may couple retention supply node 105 to local power supply node 107 when a voltage level of switch control 303 is less than a voltage level of retention supply node 105 by at least a threshold value.

Device 302 may also be a particular embodiment of a p-channel MOSFET or other suitable transconductance device. When a voltage level of switch control 304 is less a voltage level of power supply node 104 by at least a threshold value, device 302 may couple power supply node 104 to local power supply node 107, allowing current to flow from power supply node 104 to local power supply node 107, thereby providing power to circuit block 102.

When circuit block 102 is switched from a retention mode to an active mode, or vice versa, there may be a period of time, during which both of devices 301 and 302 may be active. This type of switching, commonly referred to as "make before break" may be employed so that local power supply node 107 remains powered during the transition between power supply node 104 and retention supply node 105. It is noted that in some case, e.g., a sleep mode in which circuit block 102 is completed de-powered, both device 301 and 302 may both be inactive, so that no current is being provided to local power supply node 107.

Although only two devices are depicted in the embodiment of FIG. 3A, in other embodiments, each of devices 301 and 302 may be constructed from multiple devices coupled in parallel.

Figure 3B:
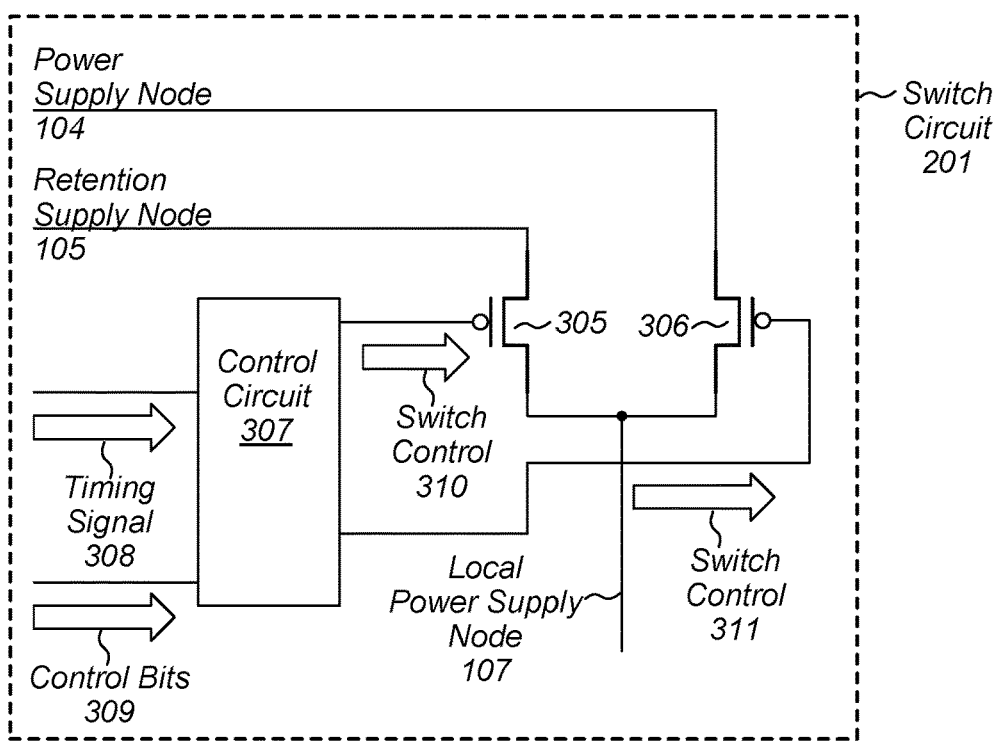
FIG. 3B illustrates a block diagram of a different embodiment of a switch circuit.

As mentioned above, the transition between different operating modes, e.g., retention mode to active mode, may be based on multiple criteria. In such cases, switch circuit 201 may combine multiple pieces of information in order to locally generate switch controls for the devices. A block diagram of a different embodiment of switch circuit 201 that locally generates switch controls is depicted in FIG. 3B. As illustrated, switch circuit 201 includes devices 305 and 306, and control circuit 307.

In a similar fashion to the embodiment depicted in FIG. 3A, devices 305 and 306 may be particular embodiments of p-channel MOSFETs, with device 305 coupled between retention supply node 105 and local power supply node 107, and device 306 coupled between power supply node 104 and local power supply node 107. Device 305 is controlled by switch control 310, and device 306 is controlled by switch control 311. Both device 305 and 306 operate in a manner similar to that described above for device 301 and 302, respectively.

Control circuit 307 may be a particular embodiment of a combinatorial logic circuit, a state machine, a sequential logic circuit, or any suitable combination thereof, configured to generate switch control 310 and switch control 311 using timing signal 308 and control bits 309. For example, control circuit 307 may determine a time to change the state of switch control 310 and 311 using timing signal 308. Control circuit 307 may use control bits 309 to enable or disable transitions on switch control 310 and 311. In some embodiments, control circuit 307 may include a delay circuit or other type of self-timed circuit to delay transitions on switch control 310 and 311 from when a transition on timing signal 308 occurs. In such cases, some of control bits 309 may be used to determine a duration of the delay.

In various embodiments, timing signal 308 may a clock signal or other signal that includes timing information. For example, timing signal 308 may be a source synchronous signal included in a multi-bit bus. Control bits 309 may, in various embodiments, include information indicative of the power states of other blocks that provide signals to circuit block 102. Both timing signal 308 and control bits 309 may be generated by circuit blocks that remain in an active mode while a computer system is active. Such circuit blocks may be referred to as "always on" and may be included as part of the computer system's power management circuits.

Figure 4:
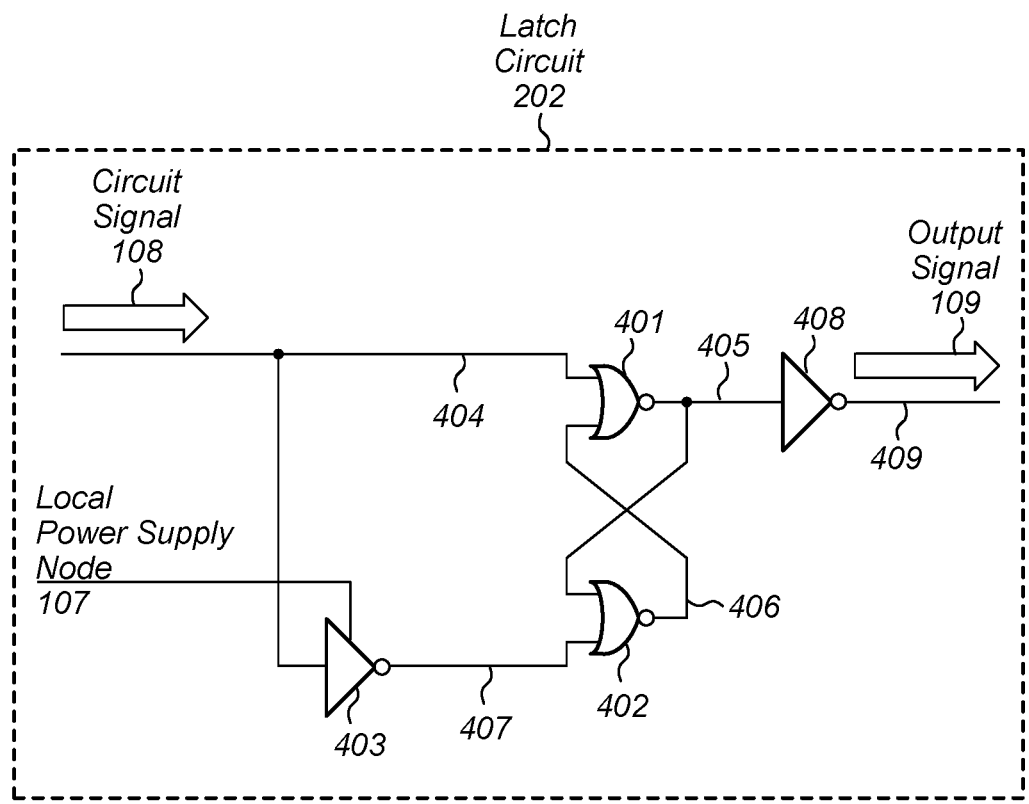
FIG. 4 illustrates a block diagram of a latch circuit.

Turning to FIG. 4, a block diagram of an embodiment of latch circuit 202 is depicted. As illustrated, latch circuit 202 includes NOR gate 401, NOR gate 402, inverter 403, and inverter 408.

Inputs of NOR gate 401 are coupled to nodes 404 and 406, and an output of NOR gate 401 is coupled to node 405. Inputs of NOR gate 402 are coupled to nodes 405 and 407, and an output of NOR gate 402 is coupled to node 406. An input of inverter 403 is coupled to node 404, and an output of inverter 403 is coupled to node 407. An input of inverter 408 is coupled to node 405, and an output of inverter 408 is coupled to node 409.

In various embodiments, circuit signal 108 propagates through node 404. In response to circuit signal 108 transitioning to a high logic level, NOR gate 401 generates a low logic level on node 405, and inverter 403 generates a low logic level on node 407. NOR gate 402 responds to the low logic levels on nodes 405 and 407 by transitioning output signal to a high logic level on node 406, which reinforces the low logic level on node 405 generated by NOR gate 401. In response to the low logic level on node 405, inverter 409 transitions output signal 109 to a high logic level on node 409.

It is noted that in the embodiment illustrated in FIG. 4, output signal 109 is generated using inverter 408 coupled to the output of NOR gate 401. Inverter 408 may, in various embodiments, provide additional drive strength to allow latch circuit 202 to drive a larger load, multiple other circuit blocks, longer wires between latch circuit 202 and a load circuit block, and the like. In other embodiments, a signal generated on node 406 may be employed as output signal 109.

When circuit signal 108 transitions to a low logic level, inverter 403 generates a high logic level on node 407. NOR gate 402 transitions node 406 to a low logic level in response to the high logic level on node 407. The combination of the low logic level of node 406 and the low logic level of circuit signal 108, results in NOR gate 401 generating a high logic level on node 405. In response to the high logic level on node 405, inverter 408 transitions output signal 109 to a low logic level on node 409.

NOR gates 401 and 402 may be particular embodiments of CMOS logic gates configured to perform the "NOT OR" Boolean function. Inverter 403 may be a particular embodiment of a CMOS inverting amplifier. In other embodiments, any suitable type of inverting amplifier, including technologies other than CMOS, may be employed. It is noted that the arrangement of gates depicted in embodiment of latch circuit 202 illustrated in FIG. 4 is merely an example. In other embodiments, similar logical functionality may be achieved using any suitable combination of OR gates, AND gates, NAND gates, or complex logic gate.

Figure 5:
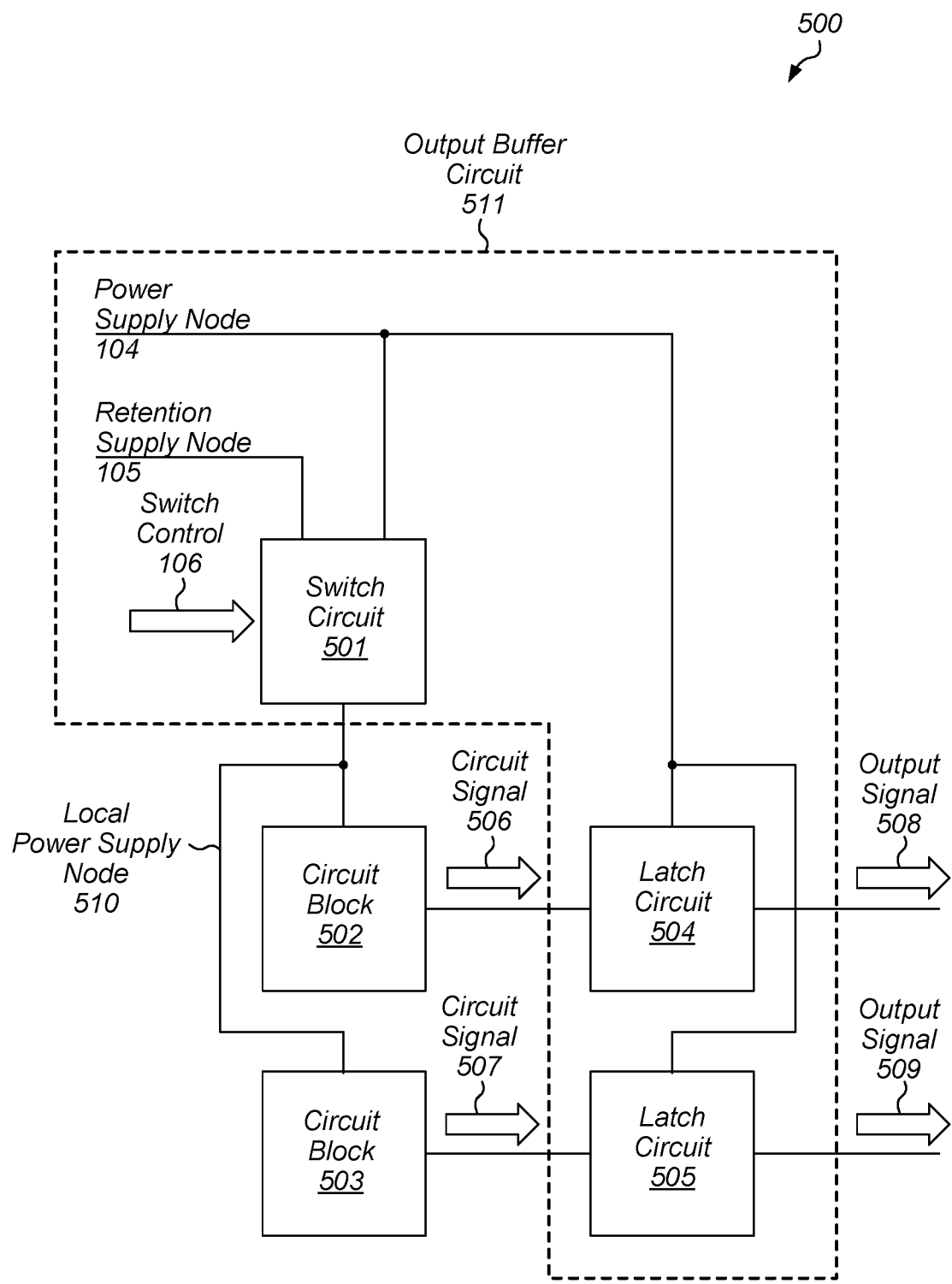
FIG. 5 is a block diagram of multiple circuit blocks and an associated output buffer circuit.

In some cases, an output buffer circuit, e.g., output buffer circuit 101, may be used in conjunction with multiple circuit blocks. A block diagram depicting an embodiment of an output buffer circuit and multiple circuit blocks is illustrated in FIG. 5. As illustrated, the embodiment includes circuit blocks 502 and 503, and output buffer circuit 511, which includes switch circuit 501, and latch circuits 504 and 505.

Circuit blocks 502 and 503 are coupled to local power supply node 510, and circuit block 502 is configured to generate circuit signal 506, while circuit block 503 is configured to generate circuit signal 507. In various embodiments, circuit blocks 502 and 503 may be particular embodiments of processor circuits, memory circuits, and the like, or any suitable portion thereof. Although each circuit block is depicted as generating a signal circuit signal, in other embodiments, each circuit block may be configured to generate a plurality of signals. It is noted that although only two circuit blocks are depicted in the embodiment of FIG. 5, in other embodiments, any suitable number of circuit blocks may be employed.

Switch circuit 501 may, in some embodiments, correspond to switch circuit 201 as depicted in FIG. 2, and may be configured to selectively couple local power supply node 510 to either power supply node 104 or retention supply node 105 using switch control 106. It is noted that sizes of devices included in switch circuit 501 may be based, at least in part, on the number of circuit blocks coupled to local power supply node 510.

Latch circuits 504 and 505 may, in various embodiments, correspond to latch circuit 202 as depicted in FIGS. 2 and 4. Latch circuit 504 is configured to generate output signal 508 using a voltage level of power supply node 104 and circuit signal 506, while latch circuit 505 is configured to generate output signal 509 using the voltage level of power supply node 104 and circuit signal 507. By using multiple latch circuits, and a single switch circuit, output buffer circuit 511 can be used in situation with multiple circuit blocks without duplicated the area associated with the switch circuit. Multiple latch circuits may also be employed in cases, where a circuit block is configured to generate multiple circuit signals.

Structures, such as those shown in FIGS. 2-5, for buffering signals generated by a circuit block may be referred to using functional language. In some embodiments, these structures may be described as including "a means for generating a circuit signal," "a means for selectively coupling either a power supply node or a retention supply node to the local supply node," and "a means for generating an output signal using the circuit signal and the voltage level of the power supply node."

The corresponding structure for "means for generating a circuit signal" is circuit block 102 and its equivalents. The corresponding structure for "means for selectively coupling either a power supply node or a retention supply node to the local supply node" is switch circuit 201 and its equivalents. Latch circuit 202, and its equivalents, is the corresponding structure for "means for generating an output signal using the circuit signal and the voltage level of the power supply node."

Figure 6:
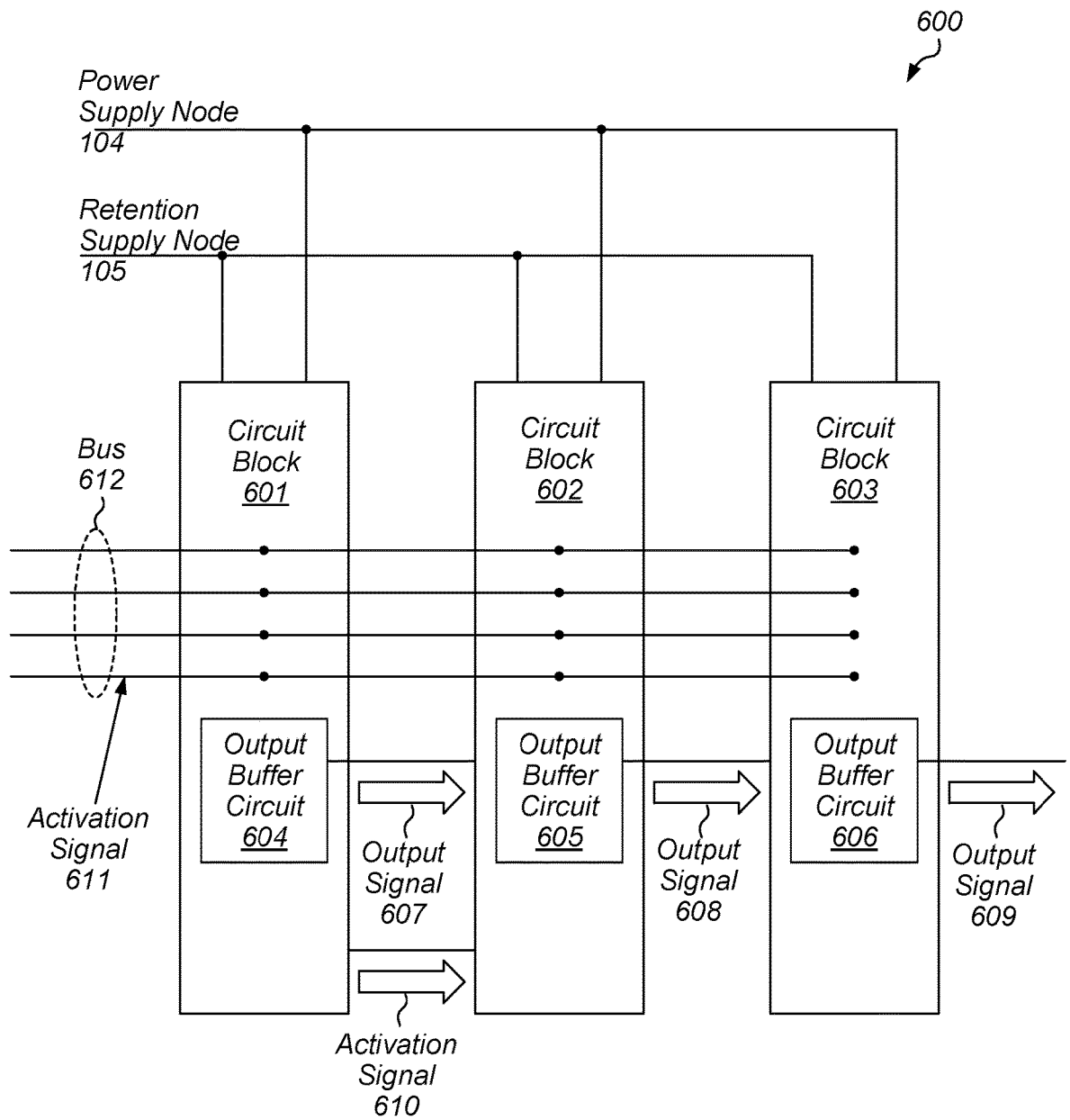
FIG. 6 is a block diagram of multiple circuit blocks coupled to a multi-bit bus.

Turning to FIG. 6, a block diagram of multiple circuit blocks in a computer system is depicted. As illustrated, circuit blocks 601-603 are coupled to bus 612, power supply node 104, and retention supply node 105. Circuit block 601 includes output buffer circuit 604, circuit block 602 includes output buffer circuit 605, and circuit block 603 includes output buffer circuit 606. Although only three circuit blocks are depicted in the embodiment of FIG. 6, in other embodiments, any suitable number of circuit blocks may be employed.

In various embodiments, output buffers circuits 604-606 may correspond to output buffer circuit 101 as depicted in FIG. 1. Output buffer circuits 604-606 are configured to generate output signals 607-609, respectively.

Included in bus 612 is activation signal 611. In various embodiments, activation signal 611 may a source synchronous signal that includes timing information for circuit blocks 601-603. In cases where circuit blocks 601-603 are operating in retention mode, activation signal 611 may be used to selectively change the operating mode of circuit blocks 601-603. For example, initially circuit block 601 will switch from retention mode to active mode using activation signal 611. Circuit block 601 may remain in active mode for some number of pulses on activation signal 611, and then return to retention mode. Alternatively, circuit block 601 may be configured to return to retention mode after a particular time period has elapsed after it entered active mode. As described above, Output buffer circuit 604 will generate output signal 607 using the voltage level of power supply node 104 so that output signal 607 can be consumed by circuit block 602.

After circuit block 601 has returned to retention mode, circuit block 602 may transition from retention mode to active mode. In some cases, circuit block 602 may transition to active mode based on a number of pulses that have occurred on activation signal 611. Alternatively, circuit block 602 may transition to active mode using activation signal 610, which is generated by circuit block 601. In various embodiments, circuit block 601 may generate activation signal 610 based on a number of pulses on activation signal 611, a configurable delay after an initial pulse on activation signal 611, or in response to a determination that some number of desired operations have been completed while in active mode.

Once circuit block 602 has transitioned to active mode, circuit block 602 may perform one or more operations before returning to retention mode. The return to retention mode may be based, at least in part, on similar criteria as those used by circuit block 601. A similar process of transitioning from retention mode, to active mode, and then back to retention mode may be performed by circuit block 603.

By only transitioning to active mode to perform operations and then returning to retention mode, circuit blocks 601-603 only dissipate active power when performing operations. The rest of the time, circuit blocks 601-603 are in retention mode, which reduces overall power dissipation of the computer system. The use of output buffer circuits, such as those described herein, allow for configurability on how a circuit block transitions from retention mode to active mode, and then back to retention mode. Moreover, latch circuits included in the output buffer circuit maintain output signals generated by the circuit blocks in a form that can be immediately consumed by other circuit blocks as they transition from retention mode to active mode.

In some cases, signals generated by different circuit blocks may be combined using a multiplex circuit that selects a particular one of the signals as an output signal using one or more selection signals. When this particular architecture is employed, only the circuit block generating the selected signal need be active. Other circuit blocks that are generating de-selected signals may remain in retention mode thereby saving power.

Figure 7:
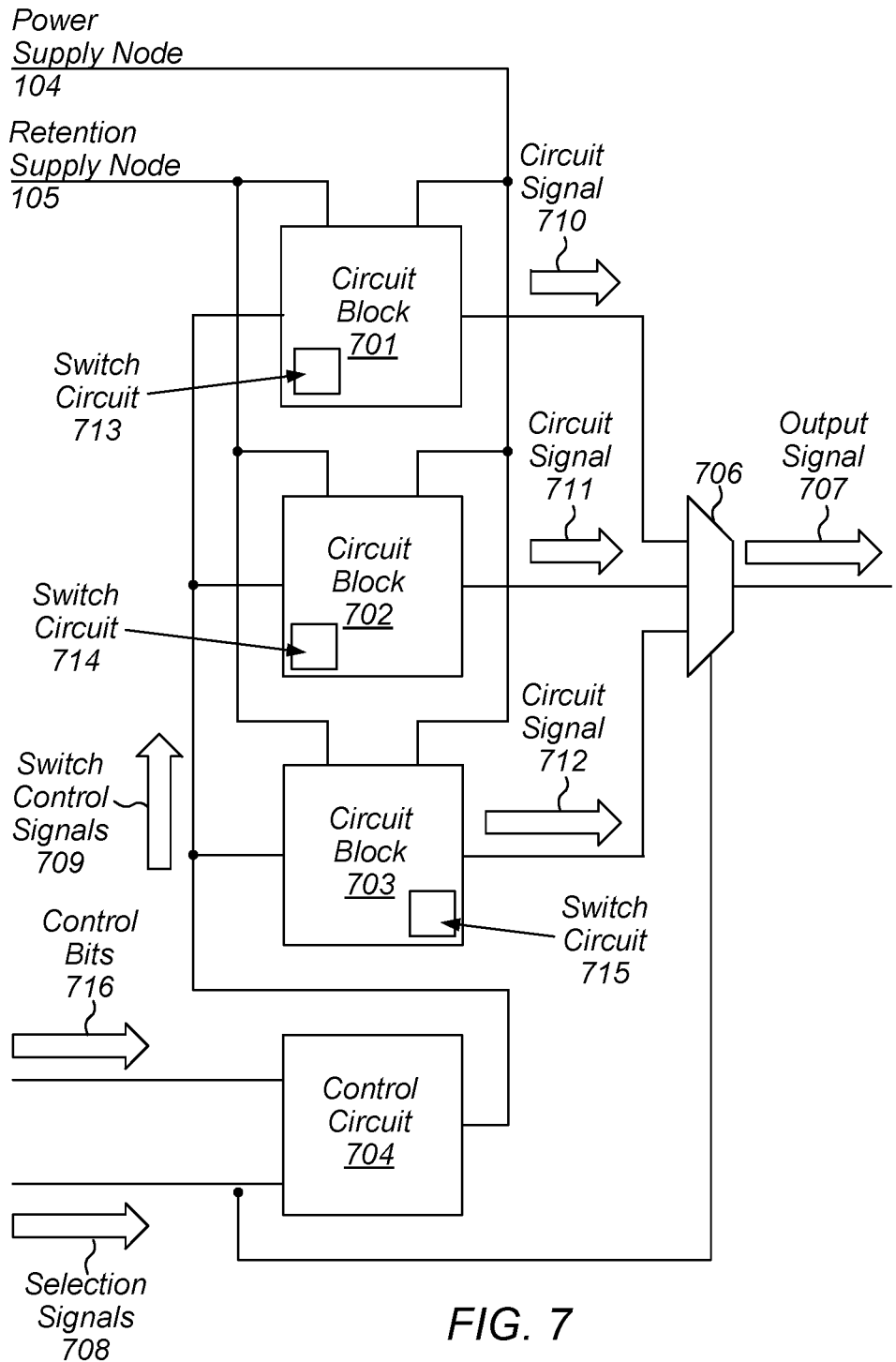
FIG. 7 is a block diagram of multiple circuit blocks coupled to a multiplex circuit.

A block diagram depicting an embodiment of portion of a computer system that employs a multiplex circuit is depicted in FIG. 7. As illustrated, the embodiment of FIG. 7 includes circuit blocks 701-704, control circuit 704 and multiplex circuit 706.

Each of circuit blocks 701-703 is coupled to power supply node 104 and retention supply node 105. Circuit block 701 includes switch circuit 713. In a similar fashion, circuit blocks 702 and 703 include switch circuits 714 and 715, respectively. In various embodiments, each of switch circuits 713-715 may correspond to switch circuit 201 as illustrated in FIG. 2, and may be configured to operate in a similar fashion to switch circuit 201. Circuit blocks 701-703 are configured to generate circuit signals 710-712, respectively.

Multiplex circuit 706 is configured to select, using selection signals 708, one of circuit signals 710-715 to generate output signal 707. In various embodiments, multiplex circuit 706 may include any suitable combination of logic gates and device configured to implement the selection function. In some cases, circuit signals 710-712 are coupled to respective logic gates, e.g., NAND gates, which are also connected to respective ones of selection signals 708. By coupling circuit signals 710-712 in such a fashion, ambiguous voltage levels on de-selected ones of circuit signals 710-712 resulting from the corresponding ones of circuit blocks 701-703 being in retention mode, are prevented from propagating through the remaining circuitry in multiplex circuit 706.

Control circuit 704 may be a particular embodiment of a combinatorial logic circuit, a state machine, sequential logic circuit, or any suitable combination thereof, configured to generate switch control signals 709 using selection signals 708. For example, control circuit 704 is configured, in response to a selection of circuit signal 710 by selection signals 708, activate a corresponding one of switch control signals 709 to activate circuit block 701, while keeping others of switch control signals 709 inactive so that circuit blocks 702 and 703 remain in retention mode.

In some cases, control circuit 704 may use additional information in the form of control bits 716, to generate switch control signals 709. Control bits 716 may be used to determine a duration of switch control signals 709 are active, or an amount of active overlap between particular ones of switch control signals 709. An "always on" circuit block may, in some embodiments, generate both selection signals 708 and control bits 716.

Although three circuit blocks are depicted in the embodiment of FIG. 7, in other embodiments, any suitable number of circuit blocks may be employed. In some cases, the number of circuit blocks employed may be based, at least in part, on a number of signals that may be coupled to a given multiplex circuit.

Figure 8:
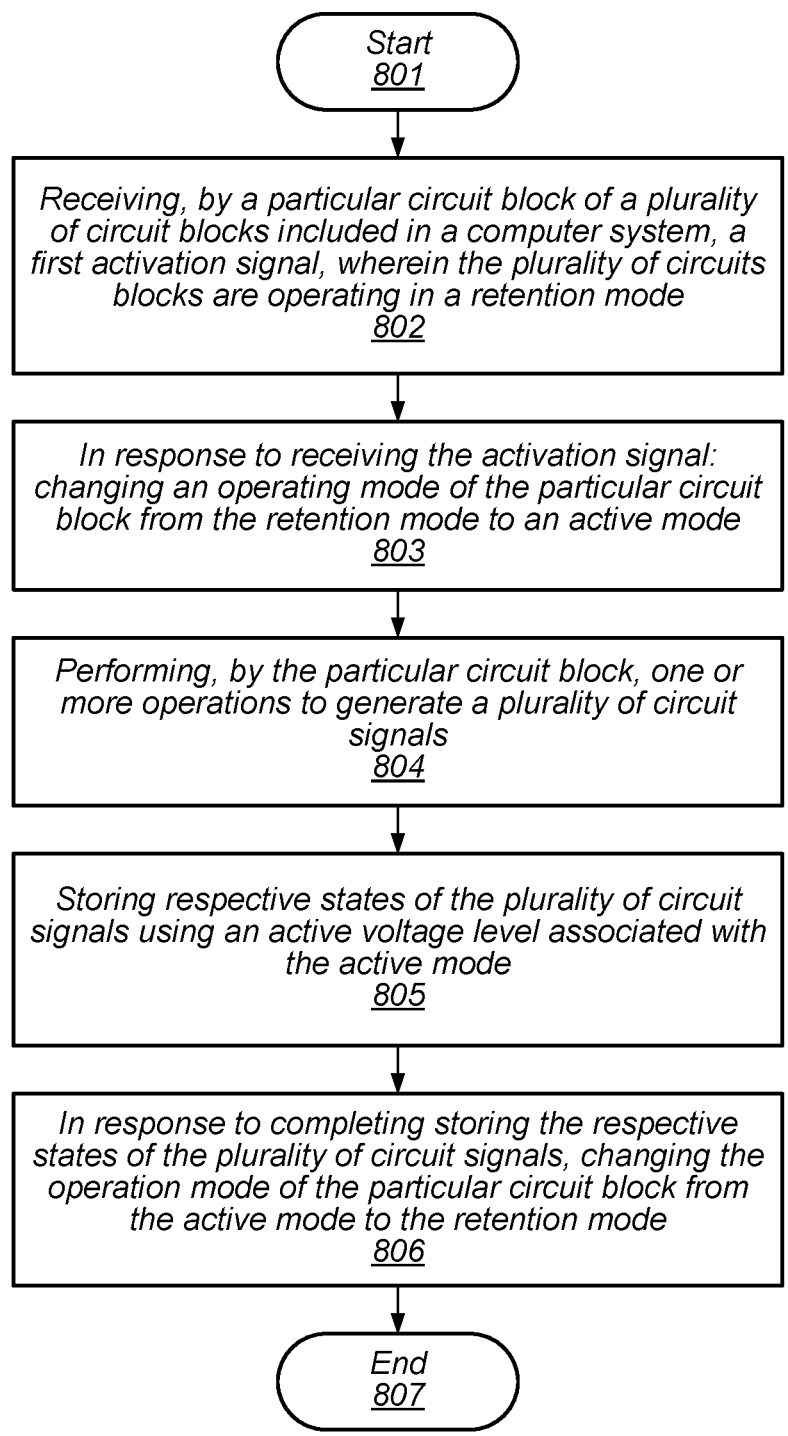
FIG. 8 illustrates a flow diagram depicting an embodiment of a method for activating circuit blocks in a computer system.

Turning to FIG. 8, a flow diagram illustrating an embodiment of a method for changing operating modes of circuit blocks in a computer system is depicted. The method, which may be applied to various circuit blocks, e.g., circuit block 102, begins in block 801.

The method includes receiving, by a particular circuit block of a plurality of circuit blocks included in a computer system, a first activation signal, where the circuit blocks are operating in a retention mode (block 802). In various embodiments, the first activation signal may be included as part of a multi-bit bus. The first activation signal may, in some cases, include a source synchronous signal that is included in the multi-bit bus.

The method also includes, in response to receiving the first activation signal, changing an operation mode of the particular circuit block from the retention mode to an active mode (block 803). In some embodiments, changing the operating mode of the particular circuit block may include decoupling a local supply node coupled to the particular circuit block from a retention supply node, and coupling the local supply node to a power supply node whose voltage level is greater than a voltage level of the retention supply node.

The method further includes performing, by the particular circuit block, one or more operations to generate a plurality of circuit signals (block 804). In various embodiments, the one or more operations may include any suitable combination of arithmetic or logical operations. Additionally, or alternatively, the one or more operations may include fetching instructions or data from a memory, decoding fetched instructions, and the like.

The method also includes storing respective states of the plurality of circuit signals using an active voltage level associated with the active mode (block 805). In various embodiments, the method may include generating a plurality of output signals using the respective states of the plurality of circuit signals. Storing the respective states of the plurality of circuit signals may include, in some embodiments, storing a logic level of a particular circuit signal using a latch circuit coupled to the power supply node. As used herein, a logic level refers a voltage level that corresponds to a particular logic value. For example, in some cases, a low logic level may correspond to a voltage level that is within a particular threshold value of ground potential, while a high logic level may correspond to a voltage level that is within a different threshold value of a potential of a power supply node.

The method further includes, in response to completing storing the respective states of the plurality of circuit signals, changing the operation mode of the particular circuit block from the active mode to the retention mode (block 806).

In some embodiments, the method may include generating a second activation signal, in response to completing changing the operation mode of the particular circuit block from the active mode to the retention mode. The method may include, in some embodiments, receiving the second activation signal by a different circuit block of the plurality of circuit blocks.

In various embodiments, the method may include, in response the different circuit block receiving the second activation signal, changing an operating mode of the different circuit block from the retention mode to the active mode, and performing, by the different circuit block, one or more operations using at least one of the plurality of output signals. The method may also include changing the operation mode of the different circuit block from the active mode to the retention mode in response to completing performing the one or more operations. The method concludes in block 807.

Figure 9:
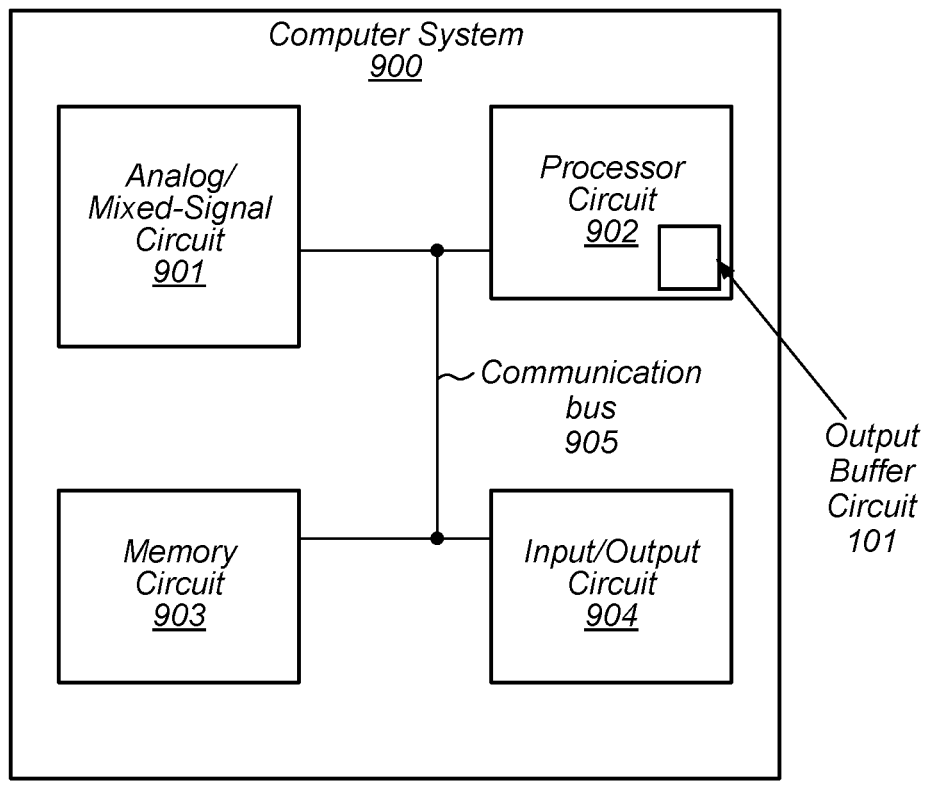
FIG. 9 is a block diagram of one embodiment of a computer system that includes an output buffer circuit.

A block diagram of computer system is illustrated in FIG. 9. As illustrated embodiment, the computer system 900 includes analog/mixed-signal circuits 901, processor circuit 902, memory circuit 903, and input/output circuits 904, each of which is coupled to communication bus 905. In various embodiments, computer system 900 may be a system-on-a-chip (SoC) and be configured for use in a desktop computer, server, or in a mobile computing application such as, a tablet, laptop computer, or wearable computing device.

Analog/mixed-signal circuits 901 may include a crystal oscillator circuit, a phase-locked loop (PLL) circuit, an analog-to-digital converter (ADC) circuit, and a digital-to-analog converter (DAC) circuit (all not shown). In other embodiments, analog/mixed-signal circuits 1401 may be configured to perform power management tasks with the inclusion of on-chip power supplies and voltage regulators.

Processor circuit 902 may, in various embodiments, be representative of a general-purpose processor that performs computational operations. For example, processor circuit 902 may be a central processing unit (CPU) such as a microprocessor, a microcontroller, an application-specific integrated circuit (ASIC), or a field-programmable gate array (FPGA). As illustrated, processor circuit 902 includes output buffer circuit 101 connected to one or more circuit sub-blocks included in processor circuit 902. Although only a single output buffer circuit is depicted as being included in processor circuit 902, in other embodiments, any suitable number of output buffer circuits may be employed.

Memory circuit 903 may in various embodiments, include any suitable type of memory such as a Dynamic Random-Access Memory (DRAM), a Static Random-Access Memory (SRAM), a Read-Only Memory (ROM), Electrically Erasable Programmable Read-only Memory (EEPROM), or a non-volatile memory, for example. It is noted that in the embodiment of a computer system in FIG. 9, a single memory circuit is depicted. In other embodiments, any suitable number of memory circuits may be employed.

Input/output circuits 904 may be configured to coordinate data transfer between computer system 900 and one or more peripheral devices. Such peripheral devices may include, without limitation, storage devices (e.g., magnetic or optical media-based storage devices including hard drives, tape drives, CD drives, DVD drives, etc.), audio processing subsystems, or any other suitable type of peripheral devices. In some embodiments, input/output circuits 904 may be configured to implement a version of Universal Serial Bus (USB) protocol or IEEE 1394 (Firewire®) protocol.

Input/output circuits 904 may also be configured to coordinate data transfer between computer system 900 and one or more devices (e.g., other computing systems or integrated circuits) coupled to computer system 900 via a network. In one embodiment, input/output circuits 904 may be configured to perform the data processing necessary to implement an Ethernet (IEEE 802.3) networking standard such as Gigabit Ethernet or 10-Gigabit Ethernet, for example, although it is contemplated that any suitable networking standard may be implemented. In some embodiments, input/output circuits 904 may be configured to implement multiple discrete network interface ports.

Figure 10:
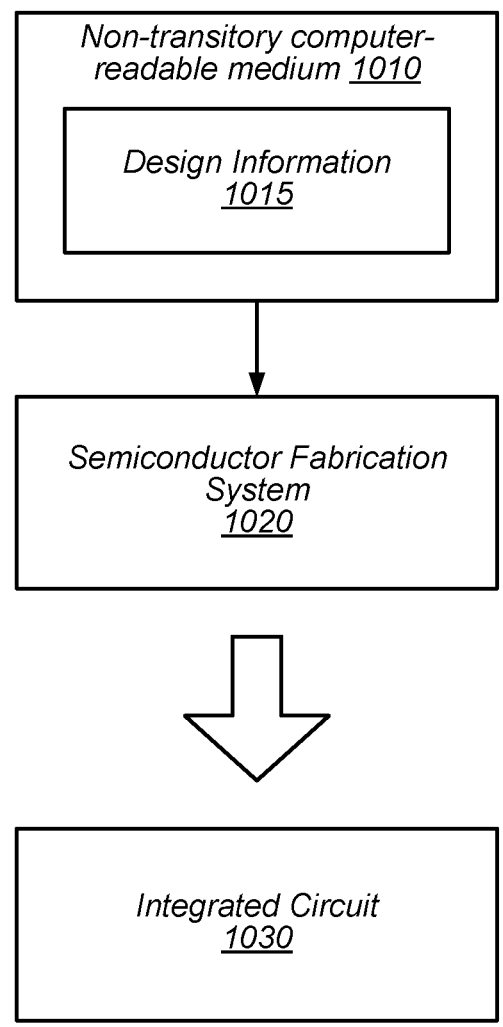
FIG. 10 illustrates an example non-transitory computer-readable storage medium that stores circuit design information.

FIG. 10 is a block diagram illustrating an example non-transitory computer-readable storage medium that stores circuit design information, according to some embodiments. In the illustrated embodiment, semiconductor fabrication system 1020 is configured to process the design information 1015 stored on non-transitory computer-readable storage medium 1010 and fabricate integrated circuit 1030 based on the design information 1015.

Non-transitory computer-readable storage medium 1010, may comprise any of various appropriate types of memory devices or storage devices. Non-transitory computer-readable storage medium 1010 may be an installation medium, e.g., a CD-ROM, floppy disks, or tape device; a computer system memory or random access memory such as DRAM, DDR RAM, SRAM, EDO RAM, Rambus RAM, etc.; a non-volatile memory such as a Flash, magnetic media, e.g., a hard drive, or optical storage; registers, or other similar types of memory elements, etc. Non-transitory computer-readable storage medium 1010 may include other types of non-transitory memory as well or combinations thereof. Non-transitory computer-readable storage medium 1010 may include two or more memory mediums, which may reside in different locations, e.g., in different computer systems that are connected over a network.

Design information 1015 may be specified using any of various appropriate computer languages, including hardware description languages such as, without limitation: VHDL, Verilog, SystemC, SystemVerilog, RHDL, M, MyHDL, etc. Design information 1015 may be usable by semiconductor fabrication system 1020 to fabricate at least a portion of integrated circuit 1030. The format of design information 1015 may be recognized by at least one semiconductor fabrication system, such as semiconductor fabrication system 1020, for example. In some embodiments, design information 1015 may include a netlist that specifies elements of a cell library, as well as their connectivity. One or more cell libraries used during logic synthesis of circuits included in integrated circuit 1030 may also be included in design information 1015. Such cell libraries may include information indicative of device or transistor level netlists, mask design data, characterization data, and the like, of cells included in the cell library.

Integrated circuit 1030 may, in various embodiments, include one or more custom macrocells, such as memories, analog or mixed-signal circuits, and the like. In such cases, design information 1015 may include information related to included macrocells. Such information may include, without limitation, schematics capture database, mask design data, behavioral models, and device or transistor level netlists. As used herein, mask design data may be formatted according to graphic data system (GDSII), or any other suitable format.

Semiconductor fabrication system 1020 may include any of various appropriate elements configured to fabricate integrated circuits. This may include, for example, elements for depositing semiconductor materials (e.g., on a wafer, which may include masking), removing materials, altering the shape of deposited materials, modifying materials (e.g., by doping materials or modifying dielectric constants using ultraviolet processing), etc. Semiconductor fabrication system 1020 may also be configured to perform various testing of fabricated circuits for correct operation.

In various embodiments, integrated circuit 1030 is configured to operate according to a circuit design specified by design information 1015, which may include performing any of the functionality described herein. For example, integrated circuit 1030 may include any of various elements shown or described herein. Further, integrated circuit 1030 may be configured to perform various functions described herein in conjunction with other components. Further, the functionality described herein may be performed by multiple connected integrated circuits.

As used herein, a phrase of the form "design information that specifies a design of a circuit configured to . . . " does not imply that the circuit in question must be fabricated in order for the element to be met. Rather, this phrase indicates that the design information describes a circuit that, upon being fabricated, will be configured to perform the indicated actions or will include the specified components.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of this disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

What is claimed is:

1. An apparatus, comprising:
   a circuit block coupled to a local supply node and configured to generate a circuit signal;
   an output buffer circuit including:
      a switch circuit configured to selectively couple, using at least one switch control signal, either a power supply node or a retention supply node to the local supply node, wherein a voltage level of the retention supply node is less than a voltage level of the power supply node; and
      a latch circuit coupled to the power supply node, wherein the latch circuit is configured to generate an output signal using the circuit signal and the voltage level of the power supply node.

2. The apparatus of claim 1, wherein to generate the output signal, the latch circuit is further configured to store a state of the circuit signal using the voltage level of the power supply node.

3. The apparatus of claim 1, wherein to selectively couple either the power supply node or the retention supply node to the local supply node, the switch circuit is further configured, in response to an activation of a retention mode for the circuit block, to:
   decouple the local supply node from the power supply node; and
   couple the local supply node to the retention supply node.

4. The apparatus of claim 3, wherein the switch circuit is further configured, in response to a deactivation of the retention mode for the circuit block, to:
   decouple the local supply node from the retention supply node; and
   couple the local supply node to the power supply node.

5. The apparatus of claim 1, wherein the switch circuit is further configured to selectively couple either the power supply node or the retention supply node to the local supply node using the at least one switch control signal and one or more control bits.

6. The apparatus of claim 1, wherein the at least one switch control signal includes a source synchronous signal included in a multi-bit bus.

7. A method, comprising:
   receiving, by a particular circuit block of a plurality of circuit blocks include in a computer system, a first activation signal, wherein the plurality of circuit blocks are operating in a retention mode;
   in response to receiving the first activation signal:
      changing a first operating mode of the particular circuit block from the retention mode to an active mode,
      performing, by the particular circuit block, one or more operations to generate a plurality of circuit signals;
      storing, by one or more latch circuits included in the particular circuit block, respective states of the plurality of circuit signals using an active voltage level associated with the active mode; and
      in response to completing storing the respective states of the plurality of circuit signals, changing the first operating mode of the particular circuit block from the active mode to the retention mode.

8. The method of claim 7, further comprising, generating a plurality of output signals using the respective states of the plurality of circuit signals.

9. The method of claim 8, further comprising, generating a second activation signal in response to completing changing the first operating mode of the particular circuit block from the active mode to the retention mode.

10. The method of claim 9, further comprising, receiving the second activation signal by a different circuit block of the plurality of circuit blocks.

11. The method of claim 10, further comprising, in response to receiving, by the different circuit block, the second activation signal:
   changing a second operating mode of the different circuit block from the retention mode to the active mode; and
   performing, by the different circuit block, one or more operations using at least one of the plurality of output signals; and
   changing the second operating mode of the different circuit block from the active mode to the retention mode in response to completing performing the one or more operations.

12. The method of claim 7, wherein changing the first operating mode of the particular circuit block from the retention mode to the active mode includes:
   decoupling, by a switch circuit included in the particular circuit block, a local supply node coupled to the particular circuit block from a retention supply node; and
   coupling, by the switch circuit, the local supply node to a power supply node whose voltage level is greater than a voltage level of the retention supply node.

13. The method of claim 12, wherein the one or more latch circuits are coupled to the power supply node.

14. An apparatus, comprising:
   a first circuit block coupled to a power supply node and a multi-bit bus that includes a first activation signal, wherein the first circuit block is configured to:
      transition, using the first activation signal, from operating in a retention mode to operating in an active mode;
      generate an internal signal while operating in the active mode; and
      transition, using the first activation signal, from operating mode in the active mode to operating in the retention mode;
   wherein the first circuit block includes a latch circuit coupled to the power supply node and configured to generate an output signal using the internal signal and a voltage level of the power supply node; and
   a second circuit block coupled to the multi-bit bus, wherein the second circuit block is configured to transition, after the first circuit block has returned to operating in the retention mode, from operating in the retention mode to the active mode using the first activation signal.

15. The apparatus of claim 14, wherein to transition operating in the retention mode to operating in the active mode, the first circuit block is further configured to:
   decouple a local power supply node included in the first circuit block from a retention supply node; and
   couple the local power supply node to the power supply node, wherein a voltage level of the power supply node is greater than a voltage level of the retention supply node.

16. The apparatus of claim 14, wherein the first circuit block is further configured to transition from operating in the active mode to operating in the retention mode after a particular number of transitions have occurred on the first activation signal.

17. The apparatus of claim 14, wherein the second circuit block is further configured to transition from operating in the retention mode to operating the active mode in response to a determination that a particular number of transitions have occurred on the first activation signal since the first circuit block returned to operating in the retention mode.

18. The apparatus of claim 14, wherein the first circuit block is further configured to generate a second activation signal in response to a determination that the first circuit block has transitioned from operating in the active mode to operating in the retention mode.

19. The apparatus of claim 18, wherein the second circuit block is further configured to transition, using the second activation signal, from operating in the retention mode to the active mode.

* * * * *